United States Patent
Graninger et al.

(10) Patent No.: US 11,616,187 B2
(45) Date of Patent: Mar. 28, 2023

(54) SUPERCONDUCTING BUMP BOND ELECTRICAL CHARACTERIZATION

(71) Applicants: Aurelius L. Graninger, Sykesville, MD (US); Joel D. Strand, Ellicott City, MD (US); Micah John Atman Stoutimore, Kensington, MD (US); Zachary Kyle Keane, Baltimore, MD (US); Jeffrey David Hartman, Severn, MD (US); Justin C. Hackley, Catonsville, MD (US)

(72) Inventors: Aurelius L. Graninger, Sykesville, MD (US); Joel D. Strand, Ellicott City, MD (US); Micah John Atman Stoutimore, Kensington, MD (US); Zachary Kyle Keane, Baltimore, MD (US); Jeffrey David Hartman, Severn, MD (US); Justin C. Hackley, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 289 days.

(21) Appl. No.: 17/168,443

(22) Filed: Feb. 5, 2021

(65) Prior Publication Data
US 2021/0257532 A1    Aug. 19, 2021

Related U.S. Application Data

(62) Division of application No. 16/241,661, filed on Jan. 7, 2019, now Pat. No. 10,950,778.

(51) Int. Cl.
*H01L 39/02* (2006.01)
*G01R 31/28* (2006.01)
(Continued)

(52) U.S. Cl.
CPC ........ *H01L 39/025* (2013.01); *G01R 31/2884* (2013.01); *H01L 22/12* (2013.01);
(Continued)

(58) Field of Classification Search
CPC ....... H01L 39/025; H01L 22/12; H01L 24/16; H01L 24/81; H01L 25/0657; H01L 27/18;
(Continued)

(56) References Cited

U.S. PATENT DOCUMENTS 5,026,682 A      6/1991   Clark et al.
10,727,391 B2 *  7/2020   Abraham ............ H01L 39/2493
(Continued)

FOREIGN PATENT DOCUMENTS

WO    2017079417 A1    5/2017
WO    2018212041 A1    11/2018

OTHER PUBLICATIONS

Foxen, et al.: "Qubit Compatible Superconducting Interconnects"; Quantum Physics (quant-ph); Applied Physics (physics.app-ph); Instrumentation and Detectors (physics.ins-det); http://iopscience.iop.org/article/10.1088/2058-9565/aa94fc; arXiv:1708.04270 [quant-ph]; Sep. 29, 2017; pp. 1-19.
(Continued)

*Primary Examiner* — Shouxiang Hu
(74) *Attorney, Agent, or Firm* — Tarolli, Sundheim, Covell & Tummino LLP

(57) ABSTRACT

Test structures and methods for superconducting bump bond electrical characterization are used to verify the superconductivity of bump bonds that electrically connect two superconducting integrated circuit chips fabricated using a flip-chip process, and can also ascertain the self-inductance of bump bond(s) between chips. The structures and methods leverage a behavioral property of superconducting DC SQUIDs to modulate a critical current upon injection of
(Continued)

magnetic flux in the SQUID loop, which behavior is not present when the SQUID is not superconducting, by including bump bond(s) within the loop, which loop is split among chips. The sensitivity of the bump bond superconductivity verification is therefore effectively perfect, independent of any multi-milliohm noise floor that may exist in measurement equipment.

20 Claims, 6 Drawing Sheets

(51) Int. Cl.
    *H01L 21/66* (2006.01)
    *H01L 23/00* (2006.01)
    *H01L 25/065* (2023.01)
    *H01L 27/18* (2006.01)
    *H01L 39/08* (2006.01)
    *H01L 39/10* (2006.01)
    *H01L 39/12* (2006.01)
    *H01L 39/06* (2006.01)
    *H01L 39/22* (2006.01)

(52) U.S. Cl.
    CPC .............. *H01L 24/16* (2013.01); *H01L 24/81* (2013.01); *H01L 25/0657* (2013.01); *H01L 27/18* (2013.01); *H01L 39/06* (2013.01); *H01L 39/08* (2013.01); *H01L 39/10* (2013.01); *H01L 39/12* (2013.01); *H01L 39/223* (2013.01); *H01L 2224/13109* (2013.01); *H01L 2224/16145* (2013.01); *H01L 2224/81024* (2013.01); *H01L 2224/81908* (2013.01); *H01L 2225/06513* (2013.01); *H01L 2225/06596* (2013.01); *H01L 2924/1423* (2013.01)

(58) Field of Classification Search
    CPC . H01L 2224/13109; H01L 2224/16145; H01L 2224/81024; H01L 2224/81908; H01L 2225/06513; H01L 2225/06596; H01L 2924/1423; H01L 39/223; H01L 39/225; H01L 39/249; H01L 39/2493; H01L 39/00; H01L 39/02; H01L 39/24; H01L 39/2464; G01R 31/2884; G01R 31/71; G01R 33/1246; G01R 33/0354; G01R 33/0358; G01R 33/022; G01R 33/035; G01R 33/0356; G01R 31/07; Y10S 505/846; Y10S 505/702; Y10S 505/701
    See application file for complete search history.

(56) References Cited

U.S. PATENT DOCUMENTS

| | | | |
|---|---|---|---|
| 10,748,961 | B2 | 8/2020 | Michalak et al. |
| 2003/0040440 | A1* | 2/2003 | Wire ................ H01P 1/047 333/99 S |
| 2009/0173936 | A1 | 7/2009 | Bunyk |
| 2017/0373044 | A1 | 12/2017 | Das et al. |
| 2018/0366634 | A1 | 12/2018 | Mutus et al. |
| 2019/0103541 | A1 | 4/2019 | Abraham et al. |
| 2019/0103542 | A1 | 4/2019 | Abraham et al. |
| 2019/0164077 | A1 | 5/2019 | Roberts et al. |
| 2020/0119251 | A1 | 4/2020 | Yohannes et al. |
| 2020/0321506 | A1* | 10/2020 | Kelly ................ H01P 5/028 |

OTHER PUBLICATIONS

Henkels: "Accurate Measurement of Small Inductances or Penetration Depths in Superconductors"; Appl. Phys. Lett. 32(12), Jun. 15, 1978; doi: 10.1063/1.89940; View online: https://doi.org/10.1063/1.89940; Published by the American Institute of Physics; p. 829-831.

Miyazaki T et al: "Development of SFQ Multi-Chip Modules for Quantum Bits", IEEE Transactions on Applied Superconductivity, IEEE Service Center, Los Alamitos, CA, US, vol. 17, No. 2, Jun. 1, 2007 (Jun. 1, 2007 ), pp. 158-161, XP011188403, ISSN: 1051-8223, DOI: 10.1109/TASC.2007.898702.

Wikipedia: "SQUID"; found Jan. 7, 2019 at: https://en.wikipedia.org/wiki/SQUID.

Yorozu S et al: 11 Sub-Kelvin single flux quantum control circuits and multi-chip packaging for supporting superconducting qubit, Journal of Physics: Conference Series, Institute of Physics Publishing, Bristol, GB, vol. 43, No. 1, Jun. 1, 2006 (Jun. 1, 2006), pp. 1417-1420, XP020110510, ISSN: 1742-6596, OI: 10.1088/1742-6596/43/1/347 p. 1418, line 13-p. 1419, line 3; figure 2.

* cited by examiner

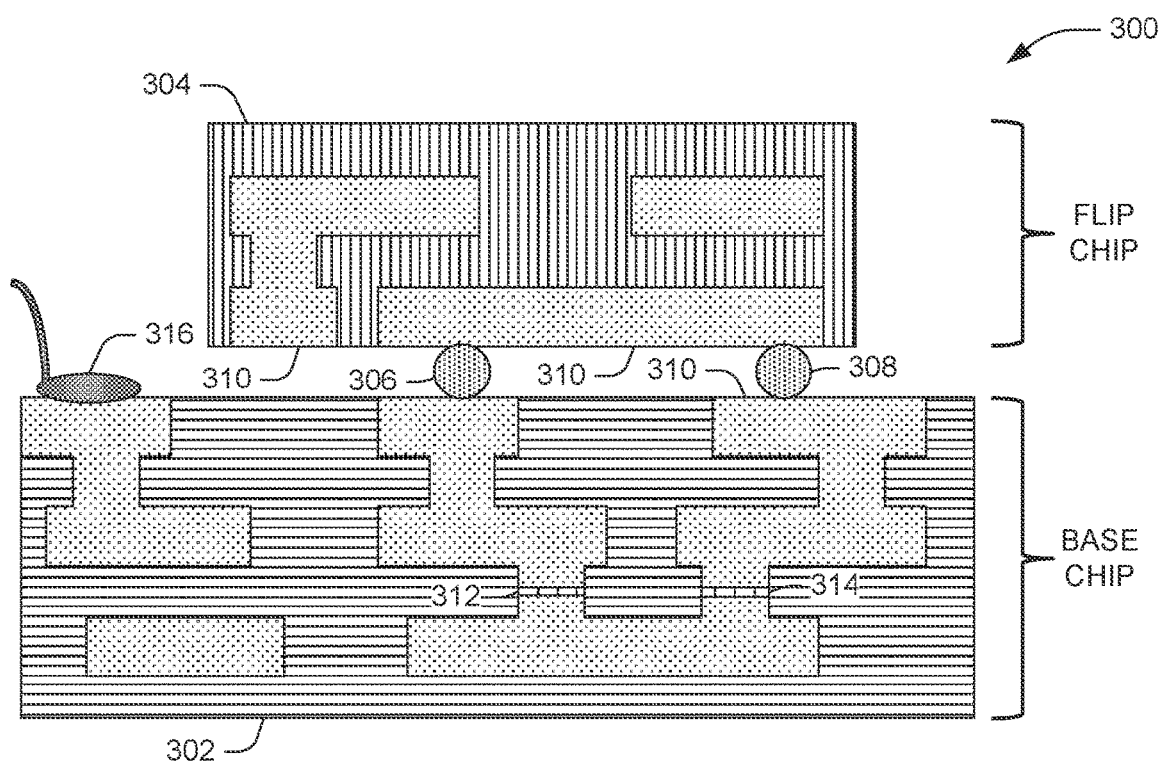
FIG. 3
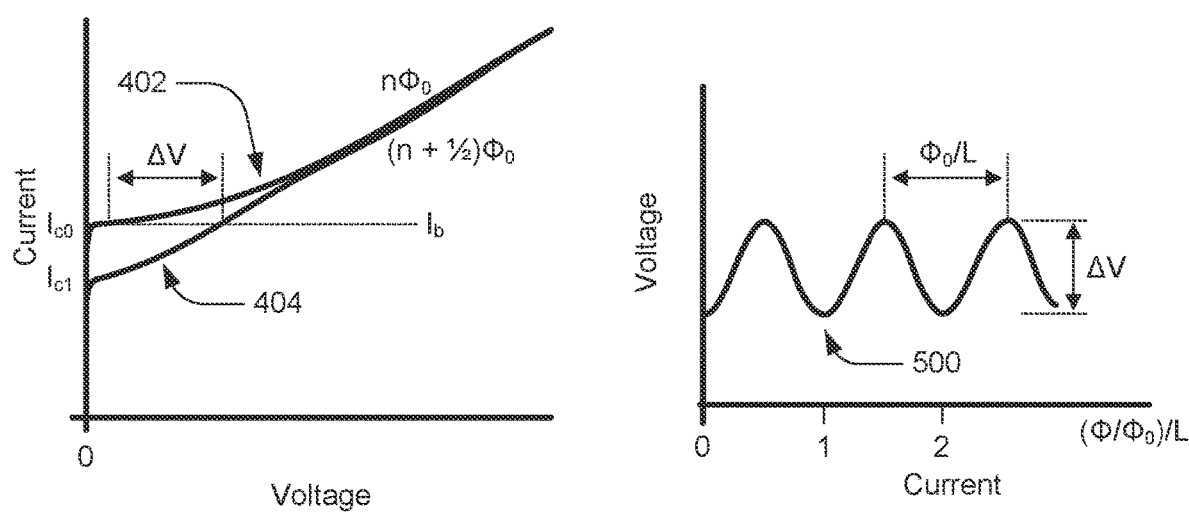
FIG. 4
FIG. 5

SUPERCONDUCTING BUMP BOND ELECTRICAL CHARACTERIZATION

GOVERNMENT INTEREST

The invention was made under Contract Number 30080864. The U.S. Government has rights to the invention as specified in that contract.

RELATED APPLICATIONS

This application claims priority from U.S. patent application Ser. No. 16/241,661, filed 7 Jan. 2019, which is incorporated herein in its entirety.

TECHNICAL FIELD

The present invention relates generally to superconducting circuits, and specifically to superconducting bump bond electrical characterization.

BACKGROUND

"Flip chip" fabrication, also known as controlled collapse chip connection (C4), is a manufacturing method for interconnecting semiconductor devices, such as integrated circuit (IC) chips, to external circuitry with balls of solder, called "bump bonds," deposited onto chip pads on the top side of a first chip near the end of a wafer process used to fabricate the first chip. To mount the first chip to external circuitry (e.g., a circuit board or a second chip or wafer), the first chip is flipped over so that what was initially its top side during its own fabrication faces down, and then is aligned so that its pads align with matching pads on the external circuitry. The solder is then reflowed to complete the interconnect. Flip chip fabrication stands in contrast to wire bonding, in which a chip is mounted upright and wires are used to interconnect the chip pads to external circuitry. Flip chip processes are used in making traditional CMOS devices, and now also in the construction of superconducting circuit devices that typically operate in refrigerated cold spaces at temperatures of around 4 kelvins or less.

SUMMARY

One example includes a bump bond superconductivity test structure. The test structure includes a first superconducting integrated circuit (IC) chip, a second superconducting IC chip galvanically connected to the first chip by bump bonds, and a DC SQUID that has a loop that electrically includes at least two of the bump bonds.

Another example includes a method of superconducting bump bond electrical characterization. The method includes applying a flux bias current through a bump bond in a DC SQUID. A modulated critical current of the DC SQUID can then be observed by measuring voltage across the DC SQUID.

Yet another example includes a device that includes two bump-bonded superconducting integrated circuits (ICs) and a DC SQUID having a single loop that traverses both of the two ICs. The device can have positive and negative bias and voltage measurement terminals in a first of the two ICs, and positive and negative flux bias terminals in the first IC. The device can also have a first Josephson junction (JJ) of the DC SQUID in one of the two ICs, the first JJ connected between a first bump bond and a first node, the first bump bond electrically connecting the first IC and a second of the two ICs, and a second JJ of the DC SQUID in one of the two ICs, the second JJ connected between a second bump bond and the first node, the second bump bond electrically connecting the first and second ICs. The DC SQUID loop can include the first and second JJs, the first and second bump bonds, and the first node.

BRIEF DESCRIPTION OF THE DRAWINGS

FIG. 3 is a cross-sectional diagram of an example bump bond superconductivity verification and inductance measurement test structure.

FIG. 4 is an example plot of an I-V curve for a DC SQUID used in an example bump bond superconductivity verification and inductance measurement test structure or method.

FIG. 5 is an example plot of an $I_c$ modulation curve for a DC SQUID used in an example bump bond superconductivity verification and inductance measurement test structure or method.

DETAILED DESCRIPTION

Figure 1:
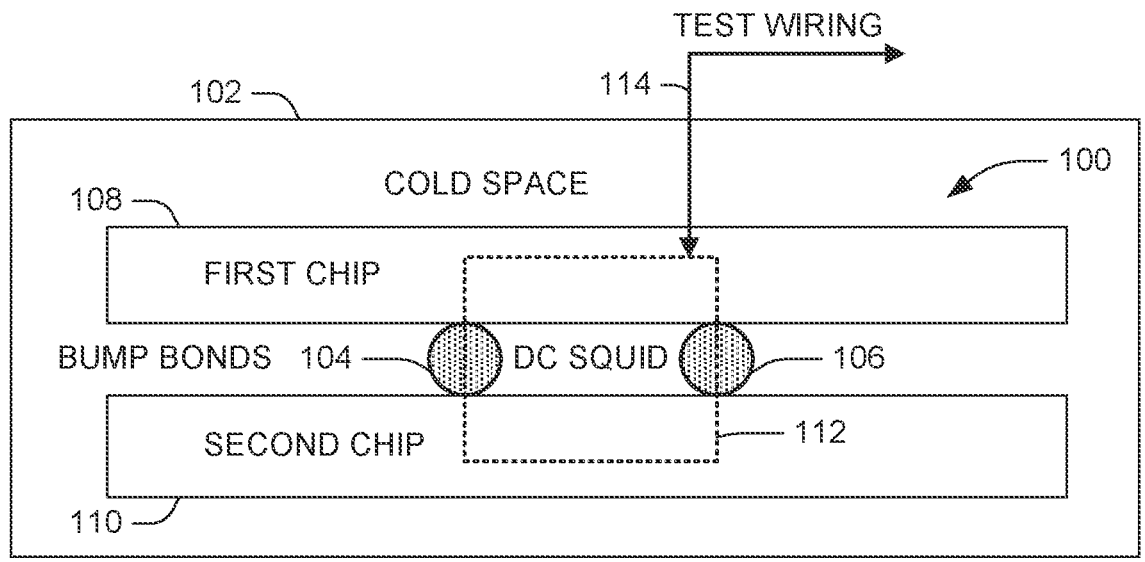
FIG. 1 is a block diagram of an example bump bond superconductivity verification and inductance measurement test structure.

Perfectly zero DC resistance is a hallmark of superconductivity. It can be difficult to verify with certainty whether or not bump bonds utilized in a flip-chip superconducting integrated circuit fabrication process are indeed superconducting, as opposed to merely having microohm or milliohm resistance, which may be adequately low resistance for many computing applications but inadequate for others. Moreover, prior to the present disclosure, it has not been possible to experimentally determine the inductance of an individual bump bond, and therefore to ascertain the effect of a concomitant parasitic inductance on a larger superconducting system into which the bump bond is integrated. Proper electrical characterization of a bump bond may be critical, for example, in determining whether a fabricated device meets specified manufacturing criteria (i.e., whether the device passes tests, or fails and therefore should be discarded or recycled, and/or whether modifications should be made to the fabrication process based on the bump bond electrical characterization to ensure that future fabricated flip-chip devices meet the specified manufacturing criteria).

Superconductivity of bump bonds can be verified by fabricating a serial array of bump bonds and measuring the resistance of the chain as a function of temperature using electronic test equipment. This test methodology is sufficient for the case of low-quality bump bonds which exhibit very highly resistive behavior. However, it is insufficient for the case of bump bonds that are highly conductive, yet may not be superconducting (e.g., those having DC resistance in the microohm to milliohm range), and furthermore does not permit for the experimental determination of the inductance of a superconducting bump bond. Moreover, generation of heat, even in a test methodology, may be undesirable in superconducting circuits that operate in a cryogenic system that may be expensive or take a long time to cool.

In the structures and methods of the present disclosure, superconducting bump bonds can be embedded into a DC SQUID so as to enable both verification of superconductivity and extraction of inductance. Superconductivity is verified in an unambiguous way by observing a periodic modulation of DC SQUID critical current while a flux bias current is driven through one of the bump bonds in the DC SQUID. This critical current modulation behavior is a result of the DC SQUID loop attempting to maintain magnetic flux quantization. The physics that govern this phenomenon break down if there is a finite resistance in the loop. The test structures and methods disclosed herein leverage this behavior and eliminate uncertainty that arises in attempting to measure small resistances that may appear to be superconducting if the electronic equipment being used to make the measurement does not have a sufficiently low noise floor. For example, absent the structures and methods disclosed herein, test equipment with a ten-milliohm noise floor is incapable of guaranteeing that a bump bond is superconducting, as opposed to having a DC resistance on the order of microohms or a few milliohms.

Accordingly, a test structure and test methodology as described herein can verify the superconductivity and extract the inductance of one or more bump bonds in a flip-chip superconducting integrated fabrication process device using a measurement made with the aid of a direct current superconducting quantum interference device (DC SQUID). The DC SQUID is configured such that circulating current flows through the bump bond(s) under test, such that a successful critical current ($I_c$) modulation measurement depends on the bump bond(s) under test being truly superconducting (as opposed to merely being of very low resistance).

FIG. 1 is a block diagram of an example superconducting bump bond electrical characterization test structure 100 in a cold space 102 as may be provided by a cryogenic refrigeration system. A superconducting-material bump bond under test 104 and another bump bond 106 connect a first chip 108 to a second chip 110. By "superconducting-material bump bond," it is meant that the bump bond is fabricated out of a material known to be superconducting under at least some practically achievable temperature conditions, i.e., greater than zero kelvins, e.g., greater than two kelvins, e.g., around three or four kelvins. The superconducting material for the bump bond may be, for example, indium or an indium alloy. Structure 100 includes a DC SQUID 112, illustrated as a broken-line box to indicate that it is electrically part of both first chip 108 and second chip 110, and is electrically connected to bump bonds 104 and 106 and configured to test the electrical characteristics of bump bond 104. First chip 108 and second chip 110 can each be, for example, an integrated circuit. First chip 108 can be, or together with second chip 110 can comprise, a multi-chip module (MCM). Second chip 110 can be a monolithic microwave integrated circuit (MMIC). First chip 108 can be called a "base chip," and second chip 110, bonded on top of first chip 108, can be termed a "flip chip"; this nomenclature convention is used in the present disclosure. Bump bonds 104, 106 can be, for example, on the order of several micrometers in diameter, e.g., between about five micrometers and about twenty micrometers in diameter, e.g., about ten micrometers in diameter.

DC SQUID 112 in FIG. 1 can comprise, for example, two Josephson junctions in parallel. In some examples, a first Josephson junction and a second Josephson junction of DC SQUID 112 are both fabricated in first chip 108. In other examples, a first Josephson junction and a second Josephson junction of DC SQUID 112 are fabricated in second chip 110. In still other examples, a first Josephson junction of DC SQUID 112 is fabricated in first chip 108 while a second Josephson junction of DC SQUID 112 is fabricated in second chip 110.

Bump bonds 104, 106 in FIG. 1 are each illustrated as being roughly spherical in shape but can each be a flattened sphere, a disc, or any other shape effective to promote superconductive or near-superconductive flow of current between first chip 108 and second chip 110. Test wiring 114 connects, directly or indirectly, to the DC SQUID to permit electrical characterizations to be observed outside of cold space 102. Not shown, the test wiring can be connected to control and/or measurement circuitry outside of the cold space. Such control and/or measurement circuitry can, for example, be configured to provide DC SQUID biasing current to critically bias DC SQUID 112, flux bias current vertically through bump bond under test 104 (e.g., and not through other bump bond 106), and/or to measure a voltage across DC SQUID 112 (e.g., as a function of applied flux bias current). Also, not shown, computation apparatus can be connected to such measurement circuitry and configured to compute an inductance of bump bond 104 based on the measured voltage across DC SQUID 112.

Figure 2:
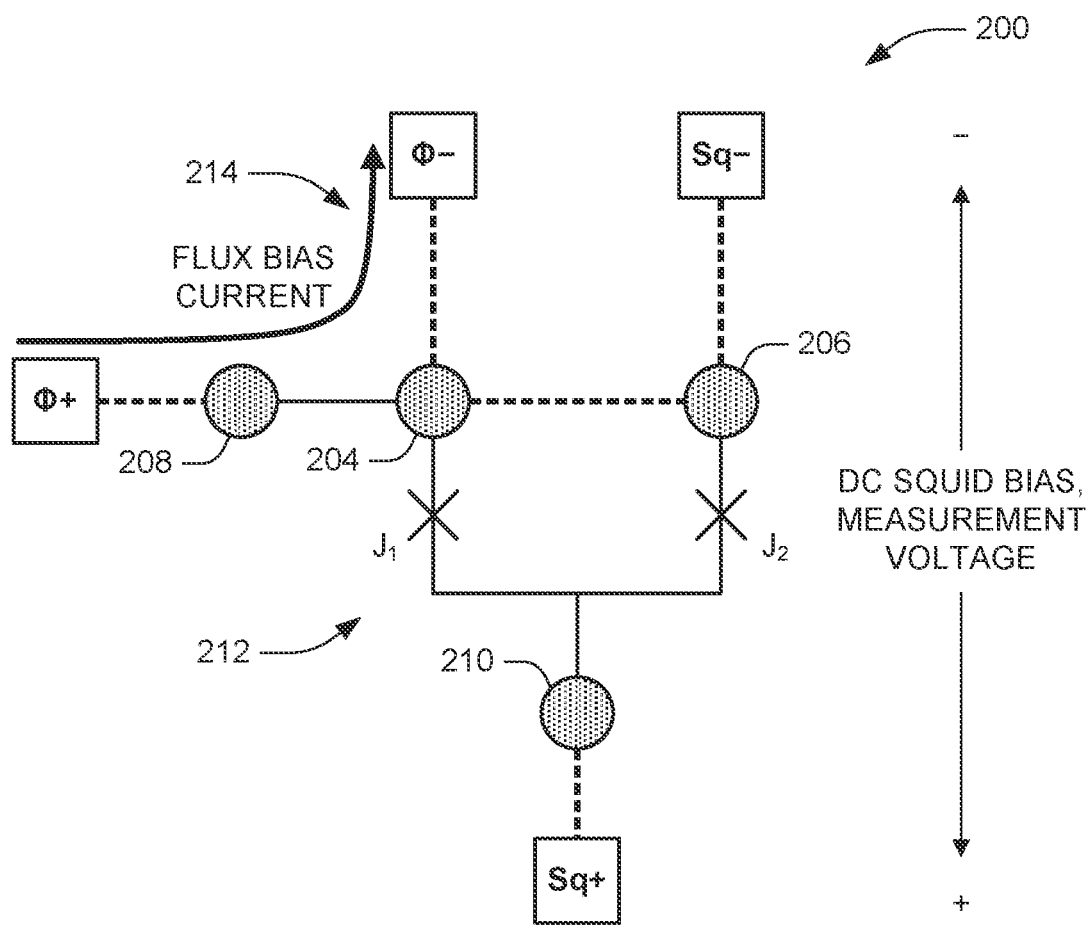
FIG. 2 is a circuit diagram for an example bump bond superconductivity verification and inductance measurement test structure.

FIG. 2 illustrates an example circuit schematic of a superconducting bump bond electrical characterization test structure 200. Test structure 200 includes a DC SQUID 212 comprising two Josephson junctions $J_1$ and $J_2$ in parallel. DC SQUID 212 in test structure 200 can correspond to DC SQUID 112 in the test structure 100 of FIG. 1. As illustrated, DC SQUID 212 has wiring in a first chip (e.g., a base chip) and a second chip (e.g., a flip chip) of a fully bump-bonded chipset; thicker broken lines in FIG. 2 correspond to wiring in the first chip (e.g., base chip wiring) while thinner solid lines in FIG. 2 correspond to wiring in the second chip (e.g., flip chip wiring). The loop of DC SQUID 212 comprises at least two superconducting bump bonds 204, 206, which can respectively correspond to bump bonds 104, 106 in FIG. 1. During test operation, current flows through the interface between the first and second chips that is created by the bump bonds, and thereby completes a circuit path through DC SQUID loop 212.

Still with regard to FIG. 2, two observation connections Sq+ and Sq−, are made to DC SQUID 212, one on each side of the Josephson junction pair, facilitating a measurement of the voltage across DC SQUID 212. Two flux bias current input connections Φ+ and Φ− are made to bump bond 204 in the DC SQUID loop, bump bond 204 being the bump bond under test in the illustrated structure 200, in order to insert a flux bias current 214 into the DC SQUID loop. Although both of flux bias current input connections Φ+, Φ− may be made in one chip (e.g., as illustrated, in the first chip), the conductive paths from flux bias current input connections can be arranged such that one of them (e.g., Φ−) is connected to the bump bond under test 204 in the first chip (e.g., base chip), while the other connection (e.g., Φ+) is made to the bump bond under test 204 via the second chip (e.g., flip chip, here by way of bump bond 208), ensuring that the flux bias current flows vertically through bump bond 204, i.e., between first and second chips.

In that all input/output (I/O) electrical connections Sq+, Sq−, Φ+, Φ− are only on the first chip in the example shown in FIG. 2, the circuit diagram 200 of FIG. 2 reflects the practical scenario that may be present in many example implementations of test structure 100, that I/O electrical connections to the test structure may only be possible via one chip and not via the other chip, explaining the inclusion of other bump bonds 208, 210 between the first and second chips, which bump bonds are not under test in the illustrated example of FIG. 2. However, in circumstances where I/O electrical connections can be made via the other chip, it may not be necessary to include addition bump bonds 208, 210. For example, the test structure 200 of FIG. 2 can be modified such that the Φ+ connection connects directly to bump bond under test 204 via second-chip (e.g., flip chip) wiring without intervening bump bond 208 or first-chip (e.g., base chip) wiring, and/or the Sq+ connection connects directly to the bottom node of DC SQUID 212 via second-chip (e.g., flip chip) wiring without intervening bump bond 210 or first-chip (e.g., base chip) wiring.

Generally speaking, the testing methodology of test structure 200 involves observing critical current ($I_c$) modulation as a function of applied flux bias, using observation connections Sq+ and Sq− to measure the voltage across DC SQUID 212 so as to observe such modulation and thereby confirm the superconductivity of a bump bond under test. Specifically, when the bump bond under test is truly superconducting (as opposed to merely being of such low resistance that its resistance is beneath the noise floor of conventional resistance measurement test equipment), testing will show the critical current of DC SQUID 212 to be modulated with a periodicity that is proportional to the inductance of the bump bond under test. There are a variety of ways to conduct the test so as to observe the expected critical current modulation. One convenient way, described in greater detail below, involves biasing DC SQUID 212 close to its critical current and then measuring the voltage across observation connections Sq+ and Sq− while sweeping the flux bias applied across flux bias current input connections Φ+ and Φ−, resulting in a periodic plot like that shown in FIG. 5.

A more brute-force way of observing the expected critical current modulation is to repeatedly increment the flux bias across flux bias current input connections Φ+ and Φ−, obtaining for each such increment an I-V curve of DC SQUID 212, like those shown in FIG. 4, by measuring voltage across observation connections Sq+ and Sq− for a range of different SQUID bias currents applied between observation connections Sq+ and Sq−, and recording the critical current of each obtained I-V curve. When the bump bond(s) under test are truly superconducting, the plot of critical current versus incremented flux bias current obtained from this brute-force test method will also have a similar qualitative shape and quantitatively will have the exact same period as the aforementioned periodic plot, like that of FIG. 5, obtained above using the more convenient test methodology described previously. That is, the plot of critical current versus flux bias current will have a period of $\Phi_0/L$, where L is the inductance of the circuit portion under test (in some examples, of solely one bump bond under test).

In the first such testing methodology described above, observation connections Sq+ and Sq− can be used to bias the DC SQUID loop close to the critical current $I_c$ of the Josephson junctions, e.g., so close to $I_c$ that small changes in critical current $I_c$ due to injected magnetic flux result in measurable changes in voltage across the DC SQUID loop. For example, electrical energy can be supplied via observation connections Sq+ and Sq− to bias the DC SQUID loop to within fifteen percent of $I_c$, e.g., within ten percent of $I_c$, e.g., within five percent of $I_c$. With DC SQUID 212 appropriately biased, a flux bias current 214 can be steadily increased between flux bias current input connections Φ+ and Φ−, and the voltage across DC SQUID 212 (i.e., between observation connections Sq+ and Sq−) can be measured as a function of this flux bias current 214. As noted previously, flux bias current 214 flows vertically (i.e., between first and second chips) through bump bond under test 204, and bump bond under test 204 is the only portion of the DC SQUID loop through which flux bias current 214 flows. In the circumstance that the initial biasing between observation connections Sq+ and Sq− is just above the critical current $I_c$, it still works to increase current between flux bias current input connections Φ+ and Φ−. In general, the bias current can be swept from negative to positive or positive to negative and the periodic modulation of critical current $I_c$ will still be observed so long as the circuit portion under test (e.g., a single bump bond in some examples) is truly superconducting. This remains true irrespective of whether the SQUID is biased just above or just below critical current $I_c$.

As the flux bias current 214 is increased, magnetic flux is injected into the DC SQUID loop, approximately equal to an amount 1=LI, where I is the flux bias current 214 and L is the inductance of the portion of the bias line that is galvanically coupled into the DC SQUID. In test structure 200 shown in FIG. 2, the only part of DC SQUID 212 that flux bias current flows through is bump bond 204 (i.e., the bump bond under test), meaning that L in the case of test structure 200 is the self-inductance of the bump bond under test 204, and only the self-inductance of the bump bond under test 204. Due to the preference of the DC SQUID loop to maintain a total magnetic flux through itself which is nearly equal to some integer multiple of a single flux quantum $\Phi_0$=h/2e≈2.07 mA-pH, where h is the Planck constant and e is the electron charge, the DC SQUID loop in FIG. 2 spontaneously generates circulating currents to either augment or counter the injected magnetic flux from the bias current. The result of this spontaneous generation of circulating currents is an effective modulation of $I_c$, which can be observed through the voltage measurement of DC SQUID 212 across observation connections Sq+, Sq−, as shown in plot 500 in FIG. 5.

The expected $I_c$ modulation will not occur if there is resistance in the DC SQUID loop, including any resistance bump bonds 204, 206 may have. Therefore, observation of such modulation is a confirmation that the entire DC SQUID loop is superconducting, and thus that bump bonds 204, 206 themselves, which are included in the DC SQUID loop, are superconducting. Furthermore, since $I_c$ (and thus the measurement voltage across the DC SQUID 212) modulates with a period equal to $\Phi_0$=h/2e, the inductance of bump bond under test 204 can be extracted from the $I_c$-modulation curve by solving L=Φ/I=h/2eI, where I is the amount of flux bias current 214 that induces a single period of the modulated voltage signal, as shown in FIG. 5 and discussed in greater detail below.

When adjusting a flux bias current 214 provided through flux bias current input connections Φ+, Φ−, any part of the path of such flux bias current 214 outside of the DC SQUID loop does not contribute magnetic flux into the loop. It is only when such flux bias current 214 becomes part of the DC SQUID loop—i.e., it is only when such flux bias current 214 travels down some arm of the DC SQUID loop—that such flux bias current 214 becomes relevant to the inductance measured using the structures and/or methods described herein. Because bump bond 208 is outside of DC SQUID loop, even though there may be some self-inductance associated with bump bond 208, any flux bias current 214 passing through bump bond 208 is not coupled directly to the DC SQUID 212, and thus no part of the current flowing through bump bond 208 contributes to any parameter associated with the voltage measured across DC SQUID 212, and none of the self-inductance of bump bond 208 contributes to the computed inductance of bump bond under test 204. It is not until flux bias current 214 enters the DC SQUID loop along some arm of the DC SQUID loop that flux bias current 214 injects magnetic flux into DC SQUID 212 that can subsequently be observed in the modulation measurement. Bump bond 206 is in the DC SQUID loop, but does not factor into the measurement because flux bias current 214 is not run through bump bond 206. Bump bond 210 is both outside of the DC SQUID loop and also does not have flux bias current 214 running through it; it simply serves as a way to connect to the DC SQUID 212 to perform the measurement. Consequently, the inductance computed using the test setup of FIG. 2 is the inductance of bump bond 204 alone.

FIG. 3 is a diagram illustrating, not necessarily to scale, a physical cross-section 300 of an example flip-chip process device (e.g., MCM chipset) that provides a superconducting bump bond electrical characterization test structure. Cross-section 300 shows layer-stacks for two bump-bonded chips, a first chip 302 (e.g., a base chip) and second chip 304 (e.g., a flip chip) galvanically connected by bump bonds 306, 308, which can correspond to bump bonds 104, 106 and 204, 206 in FIGS. 1 and 2. Each chip 302, 304 can have a number of wiring layers fabricated from superconducting metals, e.g., niobium or aluminum, and a number of active devices (e.g., Josephson junctions). Stipple-shaded portions of cross-section 300 represent wiring and vias 310 fabricated in chip substrates, which are shaded with horizontal and vertical hatching for first chip 302 and second chip 304, respectively. The substrates can be dielectric material in which the wiring and vias are embedded. Two Josephson junctions 312, 314 in first chip 302 can functionally correspond to Josephson junctions $J_1$, $J_2$ in FIGS. 1 and 2, although in the example illustrated in FIG. 3, the Josephson junctions are shown as having been fabricated in first chip 302 (e.g., base chip) rather than second chip 304 (e.g., flip chip).

Josephson junctions 312, 314 and the galvanic connections between them formed by wiring 310 complete a DC SQUID loop that spans both chips 302, 304. A wire-bond 316 connects to a pad on first chip 302 (e.g., MCM) to provide a conductive channel for driving in and reading out signals. Actual implementations may involve a plurality of such wire-bonds, e.g., four wire-bonds, as in the schematic of FIG. 2.

The plot of FIG. 4 illustrates two example I-V curves 402, 404 for a DC SQUID like either of the ones in FIG. 2 or 3. Each of curves 402 and 404 shows a voltage measurement (x axis) made between observation connections Sq+ to Sq− for a range of DC SQUID bias current (y axis), which is not to be confused with flux bias current according to the terminology established herein. Upper curve 402 corresponds to $n\varphi_0$ magnetic flux in the SQUID loop, resulting in a critical current of $I_{c0}$, and lower curve 404 corresponds to $(n+\frac{1}{2})\Phi_0$ magnetic flux in the SQUID loop, resulting in a critical current of $I_{c1}$, where n is an integer. The vertical region at V=0 for each curve 402, 404 represents the bias current range over which the DC SQUID is superconducting. The current at the locations where each curve 402, 404 ceases to be vertical is the critical current of the DC SQUID for that given amount of injected magnetic flux, labeled in FIG. 4 as $I_{c0}$ for curve 402 and as Id for curve 404. The critical current of the DC SQUID oscillates between $I_{c0}$ and $I_{c1}$ as magnetic flux is injected into the SQUID. The difference between $I_{c0}$ and $I_{c1}$ depends on specific design parameters of the DC SQUID, including the total inductance of the loop, but in general the critical current of the SQUID oscillates continuously between some $I_{c0}$ and $I_{c1}$ as magnetic flux is injected into the loop. Since the critical current itself depends on magnetic flux in the loop, the critical current can be measured as a function of incremented flux bias current and the periodic modulation (illustrated in FIG. 5) can thereby be observed. However, the shape of the I-V curve above the critical current also depends on the critical current, so by biasing the SQUID at some bias current $I_b$ close to $I_{c0}$, the voltage can be measured as a function of incremented flux bias current and periodic modulation can also thereby be measured. It is the periodic modulation of critical current that drives the periodic modulation of measured voltage for a fixed SQUID bias, so the two measurements are equivalent. At sufficiently low bias currents (i.e., within the vertical V=0 range), a current superconducts through the parallel Josephson junctions of the DC SQUID with no voltage drop across the DC SQUID because the Josephson junctions are superconducting, but above (in absolute value terms) the critical current $I_{c0}$ or $I_{c1}$, the Josephson junctions in the DC SQUID stop superconducting and begin to behave like resistors.

In one convenient way of performing a bump bond test, then, a DC SQUID bias current can be applied (e.g., between observation connections Sq+ and Sq− in the setup of FIG. 2) near (i.e., just above or just below) the critical current $I_c$, and an applied flux bias current can be applied (e.g., between flux bias current input connections Φ+ and Φ− in the setup of FIG. 2) to inject magnetic flux in the DC SQUID loop, which generates a circulating current around the DC SQUID loop, adding to the SQUID bias and taking the Josephson junctions in the DC SQUID back and forth between the superconducting and the non-superconducting region. Resultantly, a voltage drop sufficiently large to be easily measurable with standard measurement equipment can be observed as a periodic, roughly sinusoidal or saw-tooth function of applied flux bias. Such a test observation is shown as plot 500 in FIG. 5, which indicates measured voltage across the appropriately biased DC SQUID as a function of increasing flux bias current. I-V curves 402, 404 of FIG. 4 not only demonstrate that the DC SQUID functions, but may also be assistive in applying an appropriate SQUID bias (e.g., between observation connections Sq+ and Sq−) to bias the DC SQUID to within a suitable fraction of critical current $I_c$ so that the modulation measurement of FIG. 5 can be usefully performed.

Figure 6:
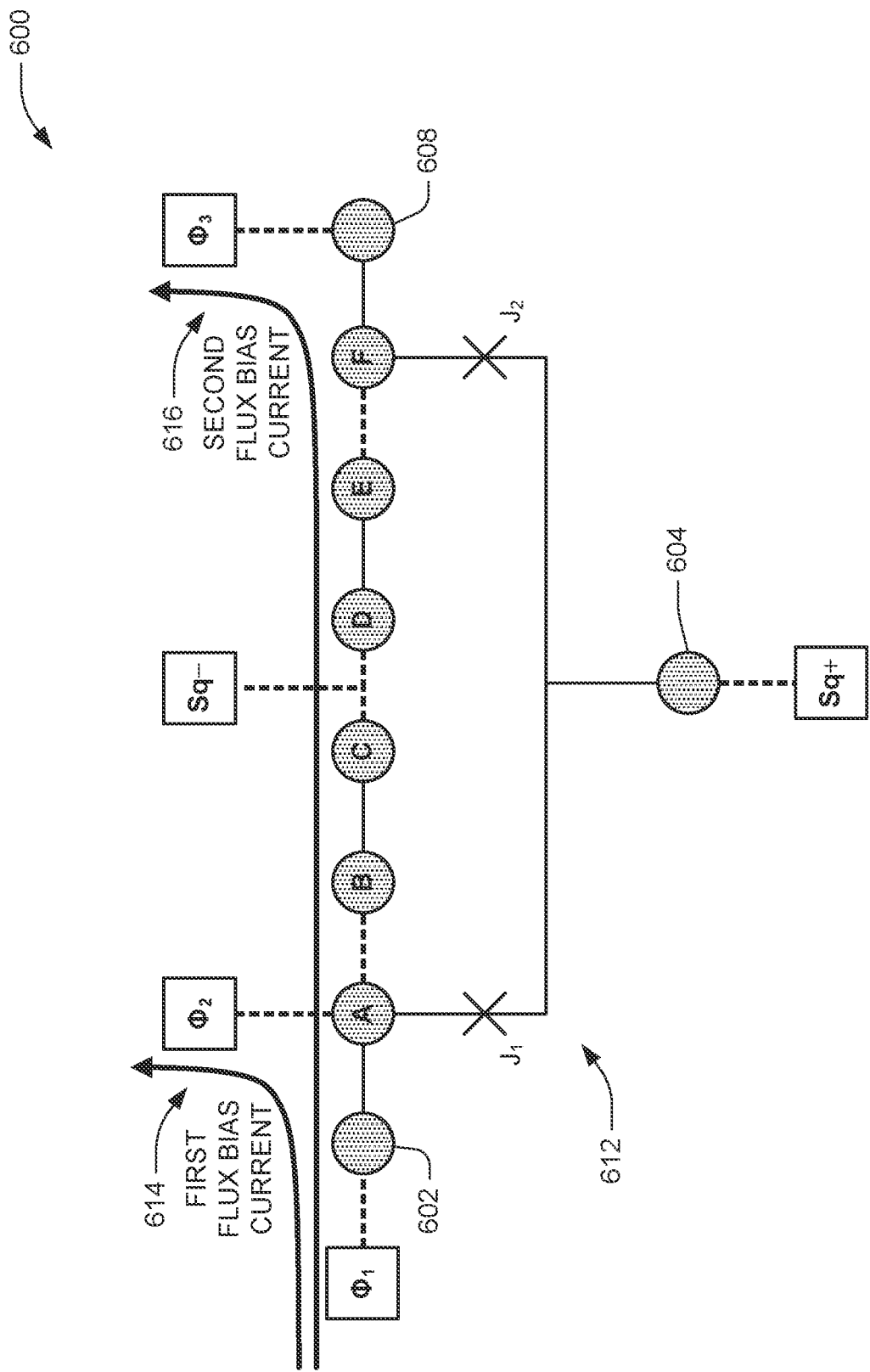
FIG. 6 is a circuit diagram for an example bump bond superconductivity verification and inductance measurement test structure.

FIG. 6 illustrates an example circuit schematic of a superconducting bump bond electrical characterization test structure 600, which expands the schematic of test structure 200 illustrated in FIG. 2 to include more measurements beyond that of just a single bump bond. As with test structure 200 of FIG. 2, test structure 600 includes a DC SQUID 612 comprising two Josephson junctions $J_1$ and $J_2$ in parallel. As illustrated, DC SQUID 612 has wiring in a first chip (e.g., a base chip) and a second chip (e.g., a flip chip) of a fully bump-bonded chipset; thicker broken lines in FIG. 6 correspond to wiring in the first chip (e.g., base chip wiring) while thinner solid lines in FIG. 6 correspond to wiring in the second chip (e.g., flip chip wiring).

In test structure 600, the loop of DC SQUID 612 comprises more than two superconducting-material bump bonds, namely, those labeled A, B, C, D, E, and F. As shown, alternate series pairs of the bump bonds can be connected to each other by galvanic connections in the first chip and in the second chip, respectively; i.e., bump bond A is connected to bump bond B by a galvanic connection in the first chip, bump bond B is connected to bump bond C by a galvanic connection in the second chip, bump bond C is connected to bump bond D by a galvanic connection in the first chip, bump bond D is connected to bump bond E by a galvanic connection in the second chip, and bump bond E is connected to bump bond F by a galvanic connection in the second chip. Thus, first chip 302 contains connections for one set of alternating pairs of bump bonds (A-B, C-D, E-F) while second chip 304 contains connections for the other set of alternating pairs of bump bonds (B-C, D-E). During test operation, current flows through the interfaces between the first and second chips that are created by bump bonds A-F, and thereby completes a circuit path through DC SQUID loop 612.

Still with regard to FIG. 6, two observation connections Sq+ and Sq− are made to DC SQUID 612, one on each side of the Josephson junction pair, facilitating both near-critical biasing of DC SQUID 612, as discussed previously, and a measurement of the voltage across DC SQUID 612. Two flux bias current input connections $\Phi_1$ and $\Phi_2$ are made to bump bond A in the DC SQUID loop, in order to insert a flux bias current into the DC SQUID loop, and a third flux bias current connection $\Phi_3$ is made to the DC SQUID loop via bump bonds 608 and F. Applying a first flux bias current 614 between flux bias current input connections $\Phi_1$ and $\Phi_2$ enables a verification of the superconductivity and a measure of the inductance of bump bond A, in a fashion similar to that described above with respect to test structure 200 in FIG. 2, whereas distinctly applying a second flux bias current 616 between flux bias current input connections $\Phi_1$ and $\Phi_3$ enables a verification of the superconductivity and a measure of the inductance of bump bonds A through F, as fabricated in the two bump-bonded chips.

As described above with respect to test structure 200 in FIG. 2, observation connections Sq+ and Sq− can be used to bias the DC SQUID loop close to the critical current $I_c$ of the Josephson junctions $J_1$, $J_2$, e.g., so close to $I_c$ that small changes in $I_c$ due to injected magnetic flux result in measurable changes in voltage across the DC SQUID loop. For example, electrical energy can be supplied via observation connections Sq+ and Sq− to bias the DC SQUID loop to within fifteen percent of $I_c$, e.g., within ten percent of $I_c$, e.g., within five percent of $I_c$. With DC SQUID 612 appropriately biased, either of the flux bias currents 614, 616 can be steadily increased between flux bias current input connections $\Phi_1$ and $\Phi_2$, or between flux bias current input connections $\Phi_1$ and $\Phi_3$, respectively, and the voltage across DC SQUID 612 (i.e., between observation connections Sq+ and Sq−) can be measured as a function of this flux bias current, to produce an output plot like the one shown in FIG. 5.

An observation of $I_c$ modulation in such a plot indicates that the bump bonds in the DC SQUID loop are superconducting, whereas a lack of observation of such modulation means that at least one of the bump bonds or at least one of the intervening superconducting wires found between bump bonds A through F in the DC SQUID loop is not superconducting. The inductance(s) can be extracted in similar fashion as described above with respect to FIG. 2. The extracted inductance is that of bump bond A in the case of application of first flux bias current 614, or that of bump bonds A through F and all intervening superconducting wires found between bump bonds A through F in the case of application of second flux bias current 616.

The examples of FIGS. 2 and 6 can be extended to include any number of bump bonds. Moreover, it is possible to provide a separate test structure 200, 600, or an extension thereof for each bump bond connecting two chips, so that each bump bond may be tested individually to verify its superconductivity or the superconductivity of several bump bonds, and to measure the inductance of each bump bond individually or the inductance of several bump bonds.

Figure 7:
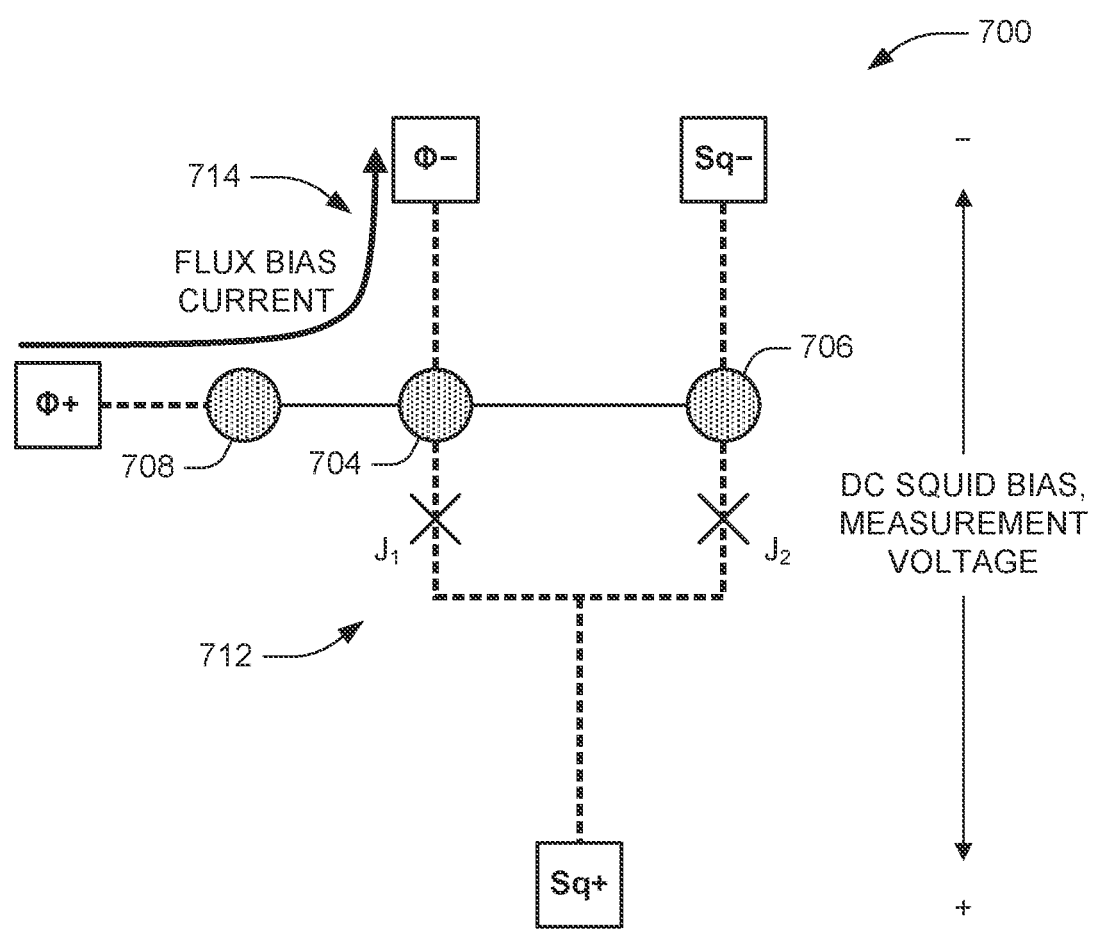
FIG. 7 is a circuit diagram for an example bump bond superconductivity verification and inductance measurement test structure.

FIG. 7 illustrates an example circuit schematic of a superconducting bump bond electrical characterization test structure 700 similar to test structure 200 of FIG. 2, but with the Josephson junctions $J_1$ and $J_2$ of DC SQUID 812 in the first chip (having wiring illustrated with thicker broken lines) as opposed to in the second chip (having wiring illustrated with thinner solid lines). Accordingly, no intermediate bump bond, like bump bond 210 of FIG. 2, is present in structure 700, and observation connection Sq+ is connected directly to the bottom node of DC SQUID 712 via first-chip wiring (illustrated as thicker broken lines). The functionality is otherwise as described above with respect to FIG. 2, such that, in one testing methodology, a near-critical DC SQUID bias current can be applied between observation connections Sq+ and Sq−, and flux bias current 714 can be applied between flux bias current input connections $\Phi$+ and $\Phi$− and therefore vertically through bump bond under test 704. When the modulated critical current behavior is observed across observation connections Sq+, Sq−, it is verified that bump bonds 704, 706 in the DC SQUID loop are both superconducting (as opposed to merely being of very low resistance), and the same voltage measurement as a function of flux bias current 714 can be analyzed to yield the self-inductance of bump bond under test 714.

Figure 8:
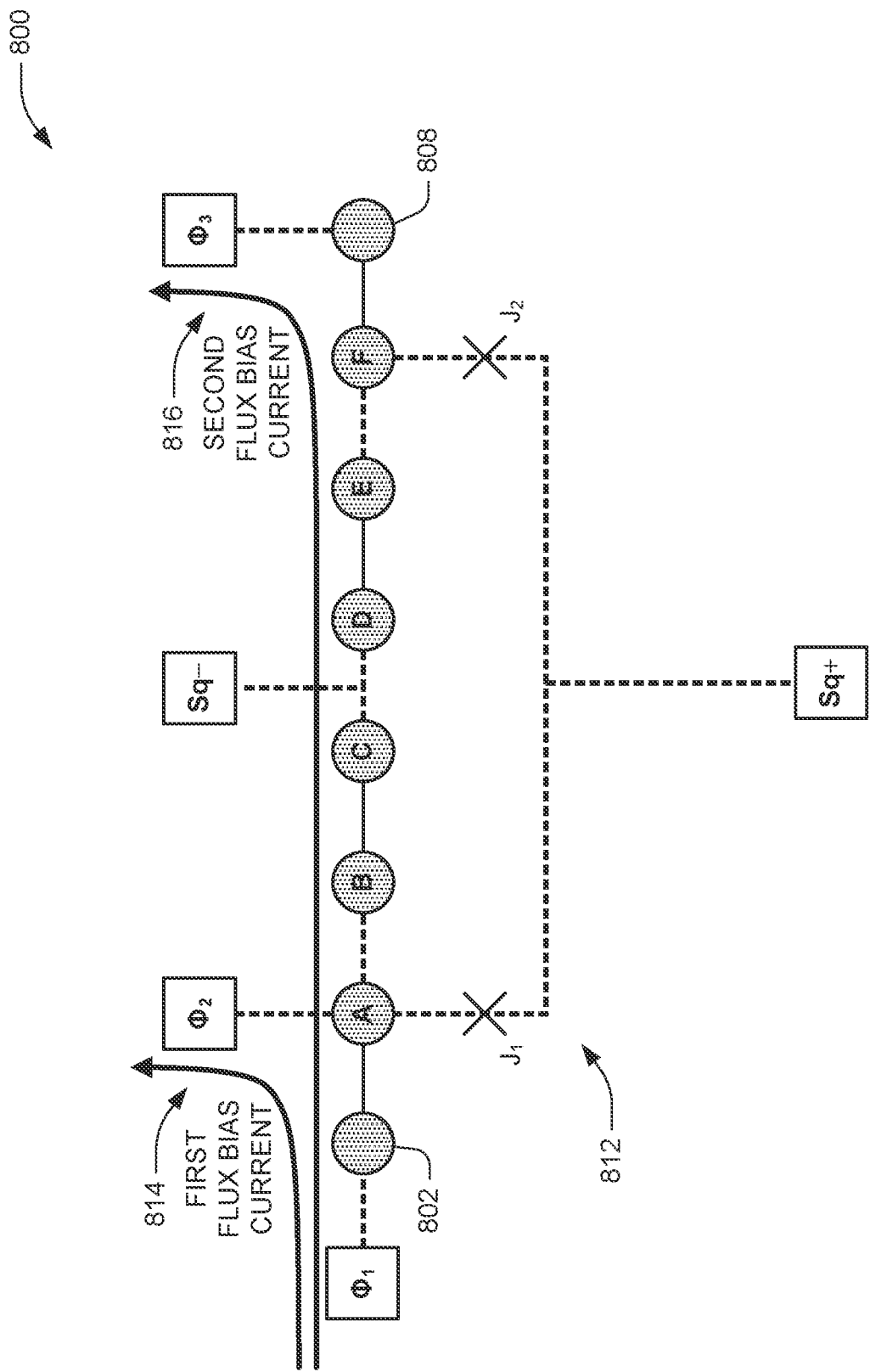
FIG. 8 is a circuit diagram for an example bump bond superconductivity verification and inductance measurement test structure.

FIG. 8 illustrates an example circuit schematic of a superconducting bump bond electrical characterization test structure 800 similar to test structure 600 of FIG. 6, but with the Josephson junctions $J_1$ and $J_2$ of DC SQUID 812 in the first chip (having wiring illustrated with thicker broken lines) as opposed to in the second chip (having wiring illustrated with thinner solid lines). Accordingly, no intermediate bump bond, like bump bond 604 of FIG. 6, is present in structure 800, and I/O connection Sq+ is connected directly to the bottom node of DC SQUID 812 via first-chip wiring (illustrated as thicker broken lines). The functionality is otherwise as described above with respect to FIG. 6, such that, in one testing methodology, a near-critical DC SQUID bias current can be applied between observation connections Sq+ and Sq−, and one of first flux bias current 814 or second flux bias current 816 can be applied between flux bias current input connections $\Phi_1$ and $\Phi_2$ or $\Phi_1$ and $\Phi_3$, respectively, and therefore vertically through bump bond under test A or through all of bump bonds A through F, respectively. When the modulated critical current behavior is observed across observation connections Sq+, Sq−, it is verified that bump bonds A through F in the DC SQUID loop are all superconducting (as opposed to merely being of very low resistance), and the same voltage measurement as a function of flux bias current 814 or 816 can be analyzed to yield the self-inductance of bump bond(s) under test A or A through F, depending on whether first flux bias current 814 or second flux bias current 816 is applied, respectively.

Figure 9:
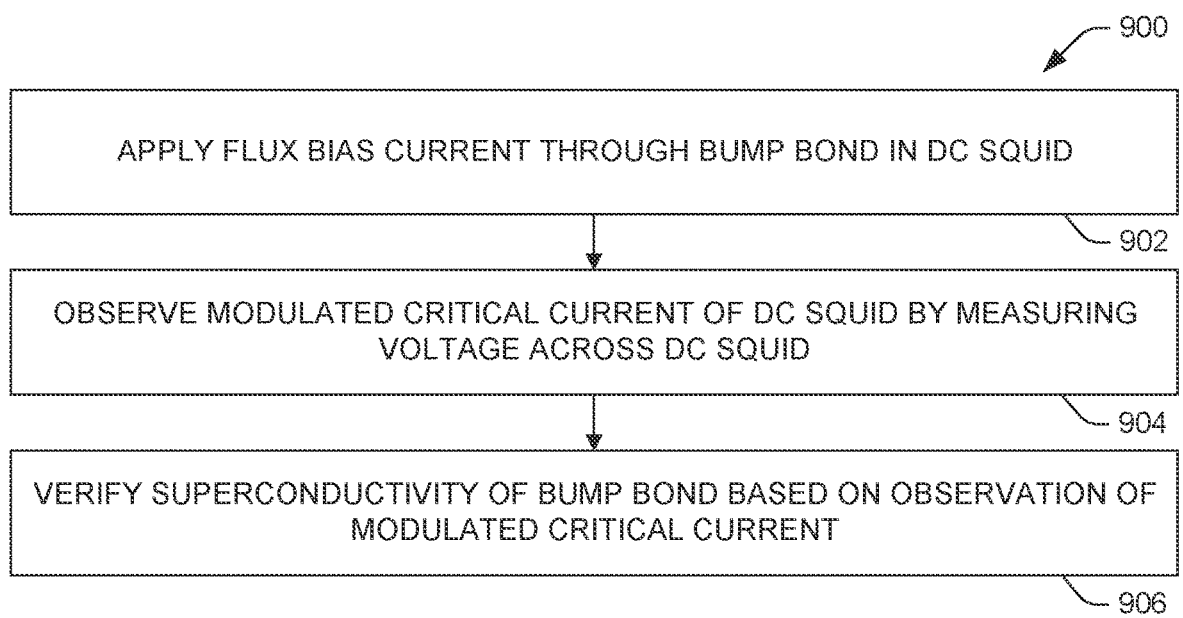
FIG. 9 is a flow chart of an example method of superconducting bump bond electrical characterization.

FIG. 9 illustrates a method 900 of verifying superconductivity of a bump bond. A flux bias current is applied 902 through a bump bond in a DC SQUID. A modulated critical current of the DC SQUID is observed 904 by measuring voltage across the DC SQUID. The bump bond is thus verified 906 to be superconductive based on the observation of the modulated critical current.

Figure 10:
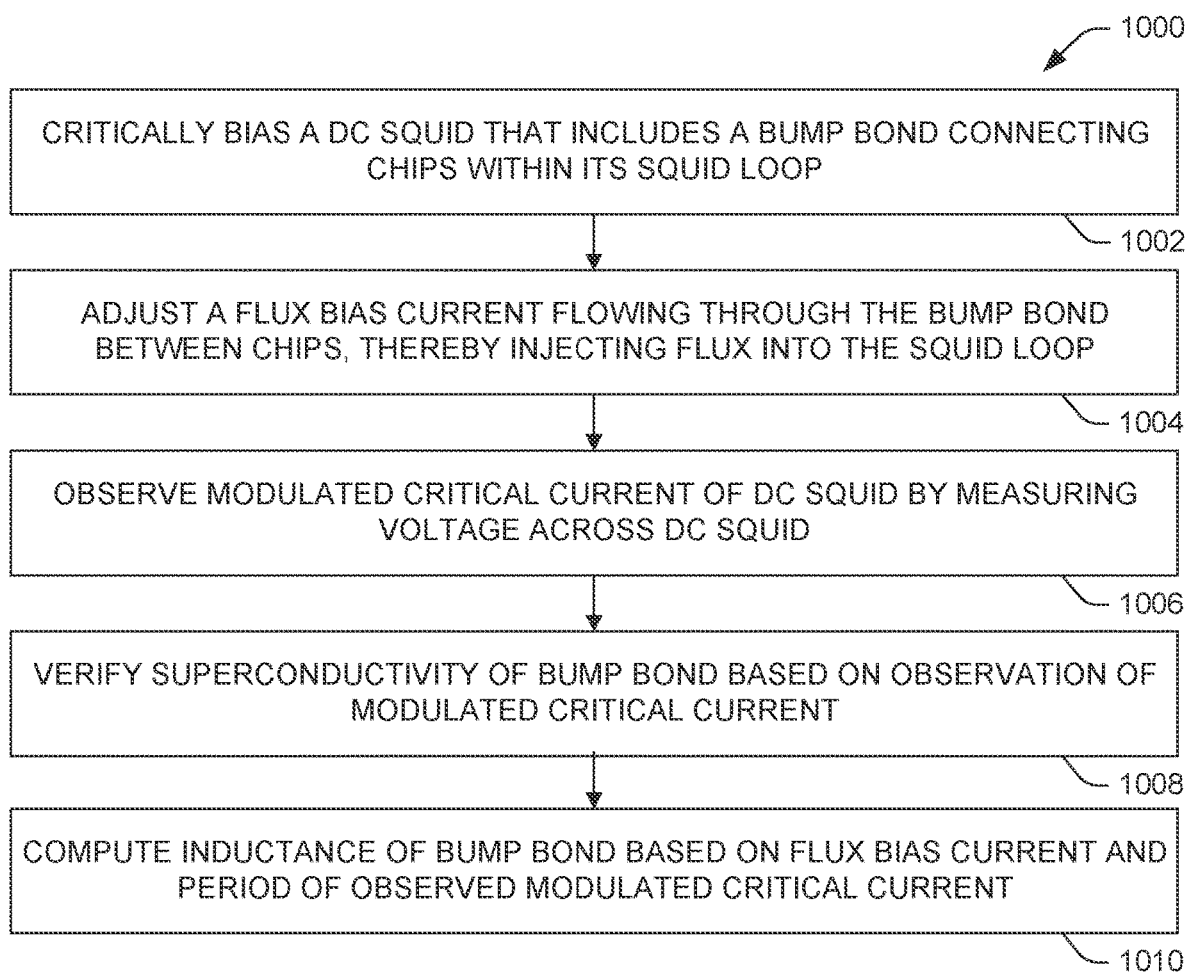
FIG. 10 is a flow chart of another example method of superconducting bump bond electrical characterization.

FIG. 10 illustrates a method 1000 of verifying superconductivity of a bump bond and/or measuring its inductance. A DC SQUID that includes a bump bond connecting chips within its SQUID loop is critically biased 1002. By "critically biased" in this context, it is meant that current through the DC SQUID, flowing from a terminal on one side of the DC SQUID to a terminal on the other side of the DC SQUID, is brought to within some small percentage of the critical current $I_c$ of the Josephson junctions of the DC SQUID, e.g., within fifteen percent of $I_c$, e.g., within ten percent of $I_c$, e.g., within five percent of $I_c$. Then, a flux bias current flowing through the bump bond between chips is adjusted (e.g., increased, e.g., swept) 1004. Magnetic flux is thereby injected into the SQUID loop. A modulated critical current of the DC SQUID is observed 1006 by measuring voltage across the DC SQUID. The bump bond can be verified 1008 to be superconductive based on the observation of the modulated critical current. The inductance of the bump bond can be computed 1010 based on the flux bias current and the period of the observed modulated critical current.

Accordingly, the test structures and methods described herein can determine whether bump bonds in a superconducting flip-chip integrated circuit process are superconducting or not, even in the regime where the bumps are highly conductive but may exhibit resistance that is below the threshold for standard measurement equipment to detect. In some applications it may be important to distinguish between a low but finite resistance and true zero resistance; the present test structures and methods can distinguish between these two cases with unambiguous certainty. Moreover, the test structures and methods described herein allow for the experimental determination of the inductance of a bump bond. This inductance value is of particular importance in the design and simulation of superconducting circuits utilizing bump bonds, as the bump bonds themselves can introduce parasitic inductance within signal paths, which should be properly accounted for in design. Accordingly, the test structures and methods described herein provide, in a single measurement, both the verification of superconductivity and the inductance of a bump bond.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method of superconducting bump bond electrical characterization comprising:
   applying a flux bias current through a bump bond in a DC SQUID;
   observing a modulated critical current of the DC SQUID by measuring voltage across the DC SQUID; and
   verifying the superconductivity of the bump bond based on the observation of the modulated critical current.

2. The method of claim 1, further comprising, prior to adjusting the flux bias current through the bump bond, critically biasing the DC SQUID by applying a biasing current through the DC SQUID.

3. The method of claim 1, further comprising computing an inductance of the bump bond based on the flux bias current and a period of the observed modulated critical current.

4. The method of claim 3, wherein the period of the observed modulated critical current is a period of the measured voltage across the DC SQUID as a function of the adjusted flux bias current.

5. The method of claim 4, wherein the inductance of the bump bond is computed according to the formula inductance $L=\Phi/I=h/2eI$, where I is the amount of flux bias current that induces a single period of the measured voltage across the DC SQUID as a function of the adjusted flux bias current.

6. The method of claim 1, wherein the DC SQUID is incorporated in a bump bond superconductivity test structure comprising:
   a first superconducting integrated circuit (IC) chip; and
   a second superconducting IC chip galvanically connected to the first chip by the bump bond and at least one other bump bond,
   wherein the DC SQUID comprises a loop that electrically includes the bump bond and the at least one other bump bond.

7. The method of claim 6, wherein the DC SQUID comprises two Josephson junctions arranged in parallel.

8. The method of claim 7, wherein the two Josephson junctions are both fabricated in the second chip but are connected to each other on one side only within the first chip.

9. The method of claim 6, wherein the test structure further comprises test wiring connected to the DC SQUID via the first chip and wherein the method further comprises:
   providing test signals to the DC SQUID from outside of a cold space when the test structure is in the cold space; and
   receiving, outside of the cold space, result signals, including the modulated critical current, from the DC SQUID.

10. The method of claim 6, wherein the test structure further comprises galvanic connections to the bump bond, and wherein the flux bias current is applied via the galvanic connections vertically through the bump bond between the first and second chips.

11. The method of claim 10, wherein the galvanic connections and the bump bond are configured such that the only part of the DC SQUID loop through which the flux bias current flows is the bump bond.

12. The method of claim 10, wherein the flux bias current modulates the critical current of the DC SQUID.

13. The method of claim 6, wherein the test structure further comprises galvanic connections to the DC SQUID, and wherein the method further comprises providing, via the galvanic connections, a critical bias current to the DC SQUID.

14. The method of claim 13, wherein the galvanic connections to the DC SQUID are further configured to provide a measurement of a voltage across the DC SQUID.

15. The method of claim 6, wherein the DC SQUID electrically includes the bump bond, the at least one other bump bond, and at least one additional bump bond arranged in series, alternate series pairs of the bump bonds being connected to each other by galvanic connections in the first chip and in the second chip, respectively.

16. The method of claim 15, wherein the test structure comprises at least three galvanic connections to the bump bonds, and wherein the applied flux bias current is applied, via at least some of the galvanic connections, vertically, through the bump bond, between the first and second chips, and a second flux bias current is applied through a plurality of the bump bonds.

17. The method of claim 1, wherein the DC SQUID and the bump bond are incorporated in a device comprising two bump-bonded superconducting integrated circuits (ICs), and wherein the DC SQUID has a single loop that traverses both of the two ICs.

18. The method of claim 17, wherein the device further comprises:
    positive and negative bias and voltage measurement terminals in a first of the two ICs by which the modulated critical current is observed;
    positive and negative flux bias terminals in the first IC by which the flux bias current is applied;
    a first Josephson junction (JJ) of the DC SQUID in one of the two ICs, the first JJ connected between the bump bond and a first node, the bump bond electrically connecting the first IC and a second of the two ICs; and
    a second JJ of the DC SQUID in one of the two ICs, the second JJ connected between a second bump bond and the first node, the second bump bond electrically connecting the first and second ICs;
    wherein the DC SQUID loop electrically comprises the first and second JJs, the bump bond, the second bump bond, and the first node.

19. The method of claim 18, wherein the only portion of the DC SQUID loop traversed by a current path between the positive and negative flux bias terminals is the bump bond.

20. The method of claim 18, wherein the device further comprises:
    a third bump bond, outside of the DC SQUID loop, electrically connecting the first and second ICs, and connected between the positive flux bias terminal and the bump bond; and
    a fourth bump bond, outside of the DC SQUID loop, electrically connecting the first and second chips, and connected between the positive bias and voltage measurement terminal and the first node.

* * * * *